United States Patent

Greer

(10) Patent No.: US 6,689,680 B2
(45) Date of Patent: Feb. 10, 2004

(54) SEMICONDUCTOR DEVICE AND METHOD OF FORMATION

(75) Inventor: Stuart E. Greer, Boynton Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/905,756

(22) Filed: Jul. 14, 2001

(65) Prior Publication Data

US 2003/0013290 A1 Jan. 16, 2003

(51) Int. Cl.$^7$ ............................................... H01L 21/44
(52) U.S. Cl. ..................... 438/614; 438/612; 438/613; 438/615
(58) Field of Search .................... 438/615, 614, 438/612, 613, 108, 118, 119; 257/766, 772, 778, 779, 735, 736, 737, 738, 750, 751, 753, 762, 763, 780, 781

(56) References Cited

U.S. PATENT DOCUMENTS

| | | | |
|---|---|---|---|
| 4,827,326 A | * 5/1989 | Altman et al. ................. 216/13 |
| 5,470,787 A | 11/1995 | Greer .......................... 437/183 |
| 6,111,321 A | 8/2000 | Agarwala |
| 6,121,682 A | * 9/2000 | Kim ........................... 257/723 |
| 6,320,263 B1 | * 11/2001 | Lopatin et al. .............. 257/758 |
| 6,348,399 B1 | * 2/2002 | Lin ............................ 438/108 |

FOREIGN PATENT DOCUMENTS

JP  06188284  7/1994

OTHER PUBLICATIONS

Koopman et al., "Chip–to–package Interconnections," Microelectronics Packaging Handbook, Chapter 6, pp. 361–453.

Liu et al., "Direct Correlation Between Mechanical Failure and Metallurgical Reaction in Flip Chip Solder Joints," Journal of Applied Physics, vol. 85, No. 7, Apr. 1, 1999, pp. 3882–3886.

Kulojarvi et al., "Effect of Dissolution and Intermetallic Formation on the Reliability of FC Joints," Microelectronics International, 1998, pp. 20–24.

Pan et al., "Microstructures of Phased–in Cr–Cu/Cu/Au bump–limiting metallization and its Soldering Behavior with High Pb Content and Eutectic PbSn Solders," American Institute of Physics, Appl. Phys. Lett. 71, Nov. 17, 1997, pp. 2946–2948.

Liu et al., High Sn Solder Reaction With Cu Metallization, Scripta Materialia, vol. 35, No. 1, pp. 65–69, 1996.

Bartush et al., "C–4 Joint Structure," *IBL Technical Disclosure Bulletin*, Jan. 1981, vol. 23, No. 8, p. 3680, XP002243853, IBM Corp., New York, USA.

Sullivan, "The Effects of Interfaces on C–4 Solder Bump Reliability," *Materials Research Society Symposium*, Pittsburg, PA, USA, vol. 515, pp. 55–66, XP008013297.

* cited by examiner

*Primary Examiner*—Carl Whitehead, Jr.
*Assistant Examiner*—Thanhha S Pham
(74) *Attorney, Agent, or Firm*—Robert A. Rodriguez; Michael J. Balconi-Lamica

(57) ABSTRACT

In accordance with one embodiment of the present invention, a semiconductor device underbump metallurgy (414) is formed over a semiconductor bond pad (128), wherein the underbump metallurgy (414) comprises a chromium, copper, and nickel phased-region (404), and wherein the presence of nickel in the phased-region (404) inhibits conversion of tin from the solder bump and other tin sources from forming spallable $Cu_6Sn_5$ copper-tin intermetallics.

7 Claims, 4 Drawing Sheets

US 6,689,680 B2

SEMICONDUCTOR DEVICE AND METHOD OF FORMATION

RELATED APPLICATIONS

The present Application is related to U.S. patent application Ser. No. 09/411,266 filed Oct. 4, 1999, and entitled "Method of Forming Copper Interconnection Utilizing Aluminum Capping Film," which is assigned to the assignee hereof and is herein incorporated by reference.

FIELD OF THE INVENTION

This invention relates in general to semiconductor devices and their method of formation, and more particularly to semiconductor devices and methods for forming semiconductor devices having Controlled Collapse Chip Connection (C4) bumps.

BACKGROUND OF THE INVENTION

Controlled Collapse Chip Connection (C4) interconnect (flip-chip bump) technology is an alternative to manual wire bonding, which involves forming solder bumps and under-bump metallurgy (UBM) structures on a semiconductor chip's bond pads. The solder bumps are used in place of the wires to electrically connect the chip's circuitry to external sources, for example to substrates used for chip packaging. The UBM provides important functions with respect to the C4 structure, among them include providing adhesion and barrier protection between the C4 solder bump and the semiconductor chip.

Conventional high-lead C4 solder bumps (solder bumps containing 97% lead and 3% tin) use an UBM integration that consists of sequentially forming a chromium, chromium-copper, copper, and gold layers over the bond pad and then forming the C4 solder bump on the gold layer. Subsequent heat processes are then used to reflow and form the C4 bump structure, wherein the gold layer provides oxidation protection of the underlying copper layer; the copper layer functions as the primary wetting surface for the C4 bump; the chromium-copper layer promotes inter-metal adhesion by functioning as a nucleating layer onto which copper and tin intermetallics ($Cu_3Sn$) grow during subsequent reflow processes; and the chromium layer functions as barrier and an adhesion promoter to the underlying semiconductor chip surface.

The reflow process by which the bump is formed as well as subsequent high-temperature processes can be problematic when excess tin from the solder bump or other sources migrates to the chromium-copper layer. The excess tin at the chromium-copper layer can cause problems with respect to reliability of the C4 bump structure. Excess tin reacts with the $Cu_3Sn$ nucleating layer thereby forming a $Cu_6Sn_5$ form of the copper-tin intermetallic. The $Cu_6Sn_5$ intermetallic is undesirable because it has a tendency to spall-off the chromium-copper layer into the solder (i.e. dissolve into the bump volume). This can result in a copper deficient chromium-to-solder interface. The chromium-to-solder interface is disadvantageous because it forms a physically weak bond with the solder bump as compared to the $Cu_3Sn$ nucleating layer. Its presence can result in undesirable electrical opens with respect to the C4 bump structure.

Conventional high-lead solder C4 bump reflow processes typically do not use time and temperature combinations that cause problems with respect to formation of the $Cu_6Sn_5$ intermetallic (conventional high-lead solder melts approximately 320 degrees Celsius). However, alternative flux agents, increases in the size of semiconductor chips, increased chip complexity, and increases in the number of bumps all will likely necessitate increased reflow times and/or temperatures to insure successful and reliable bump reflow operations. The higher time and/or temperatures will result in greater quantities of tin migrating to the UBM phased-region. In addition, many alloy materials currently being investigated to replace high-lead solders have significantly higher tin concentrations than high-lead solder currently in use by the semiconductor industry. Furthermore, other sources of tin, such as cladding from the board (board-side cladding) to which the bumps and chip are attached, can also be problematic with respect to $Cu_6Sn_5$ intermetallics. When the board-side uses a relatively low melting temperature cladding or a high-tin content cladding, tin from the cladding, when in a molten state, can also attack the copper in the UBM. Therefore, with these two potential sources of excess tin, conventional UBMs will not be adequately protected against $Cu_6Sn_5$ intermetallic formation.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements and figures may be exaggerated relative to other elements to help improve understanding of embodiments of the present invention.

DETAILED DESCRIPTION OF THE DRAWINGS

In accordance with one embodiment of the present invention, a semiconductor device UBM is formed over a semiconductor bond pad, wherein the UBM comprises a chromium, copper, and nickel phased-region, and wherein the presence of nickel in the phased-region inhibits conversion of tin from the solder bump and other tin sources from forming spallable copper-tin intermetallics.

Figure 1:
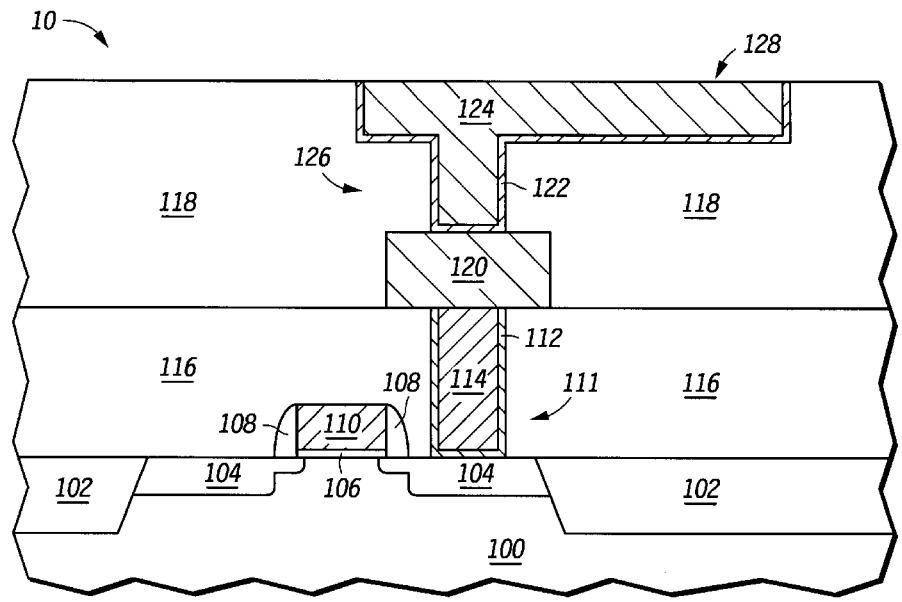
FIG. 1 includes an illustration of a cross-sectional view of a semiconductor device after forming interconnect levels and final bond pad over a semiconductor substrate.

An embodiment of the present invention will now be described more fully with references to the accompanying figures. FIG. 1 includes an illustration of a cross-sectional view of a portion of a semiconductor device 10. The semiconductor device 10 includes a semiconductor device substrate 100, field isolation regions 102, and doped regions 104 formed in the semiconductor device substrate 100. A gate dielectric layer 106 overlies portions of the semiconductor device substrate 100 and a gate electrode 110 overlies the gate dielectric layer 106. Spacers 108 are formed adjacent sidewalls of the gate electrode 110. A first interlevel dielectric layer (ILD) 116 is formed over the gate electrode 110. The ILD layer 116 is then patterned to form a contact opening that is filled with an adhesion/barrier layer 112 and a contact fill material 114. The adhesion/barrier layer 112 is typically a refractory metal, a refractory metal nitride, or combination of refractory metals or their nitrides. The contact fill material 114 typically includes tungsten, polysilicon, or the like. After depositing the adhesion/barrier layer 112 and the contact fill material 114, the substrate is polished to remove portions of the adhesion layer 112 and contact fill material 114 not contained within the contact opening, thereby forming the conductive plug 111 as shown in FIG. 1.

A first level interconnect 120 is formed overlying the ILD layer 116 and the conductive plug 111. Typically, the first level interconnect 120 is formed using a conductive material such as copper or aluminum. The first level interconnect 120 is typically formed using a combination of conventional trench and polishing processes or, alternatively, using a combination of conventional patterning and etching processes. If the first level interconnect 120 is formed using copper, a barrier (not shown) may be formed surrounding the first level interconnect 120 to reduce the migration of copper into adjacent materials.

A second ILD 118 is formed over the first ILD 116 and the first level interconnect 120. A second interconnect 126 that can include a conductive adhesion/barrier film 122 and a copper-fill material 124 is formed within the second ILD 118. The adhesion/barrier film 122 is typically a refractory metal, a refractory metal nitride, or a combination of refractory metals or their nitrides. The copper-fill material 124 is typically copper or a copper-alloy. In one specific embodiment, the copper content is at least 90 atomic percent. The copper can be alloyed with magnesium, sulfur, carbon, or the like to improve adhesion, electromigration, or other properties of the interconnect. Although, the interconnect 126 is illustrated in this embodiment as a dual inlaid interconnect, one of ordinary skill in the art recognizes that the interconnect 126 can alternatively be formed as a conductive plug in combination with a single inlaid interconnect or a lithographically patterned and etched interconnect or using alternative materials such as aluminum or aluminum alloys. After depositing the adhesion/barrier film 122 and the copper fill material 124, the substrate is polished to remove portions of the adhesion/barrier film 122 and copper fill material 124 not contained within the dual inlaid opening to form the dual inlaid interconnect 126 shown in FIG. 1. In accordance with one embodiment of the present invention, the uppermost exposed surface of the dual inlaid interconnect 126 forms a bond pad 128 for the semiconductor device.

Figure 2:
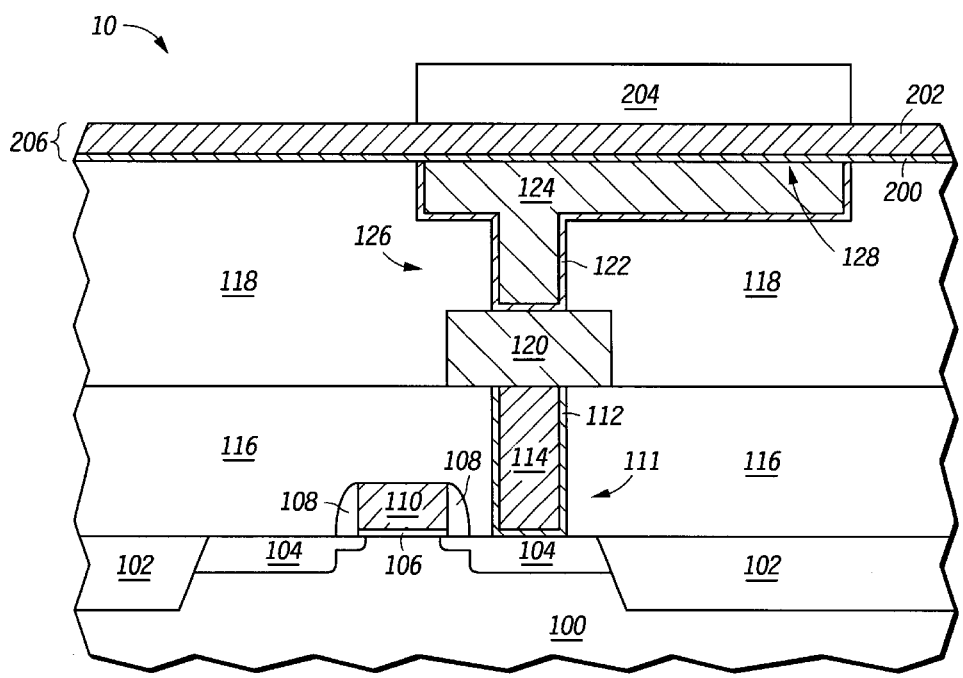
FIG. 2 includes an illustration of a cross-sectional view of the substrate shown in FIG. 1 after forming an optional transitional metallurgy layer over the substrate and patterning the optional transitional metallurgy layers with resist.

FIG. 2 illustrates a non-limiting optional embodiment of the present invention, in which a transitional metallurgy layer 206 and a patterned photoresist layer 204 are formed over the ILD 118 and the bond pad 128. In accordance with one embodiment, the transitional metallurgy layer 206 is formed using conductive films 200 and 202, wherein film 200 includes chromium or a chromium-alloy film and conductive film 202 includes an aluminum or aluminum capping film overlying conductive film 200. Both the conductive film 202 and capping film are typically deposited using conventional physical vapor deposition (PVD) methods. The use of a transitional metallurgy provides benefits that include improved adhesion and barrier protection between the bond pad and 128 and a subsequently formed C4 bump structure, which will be discussed infra. The specific details respecting the use of transitional metallurgy are contained in U.S. patent application Ser. No. 09/411,266 filed Oct. 4, 1999, and entitled "Method of Forming Copper Interconnection Utilizing Aluminum Capping Film."

Figure 3:
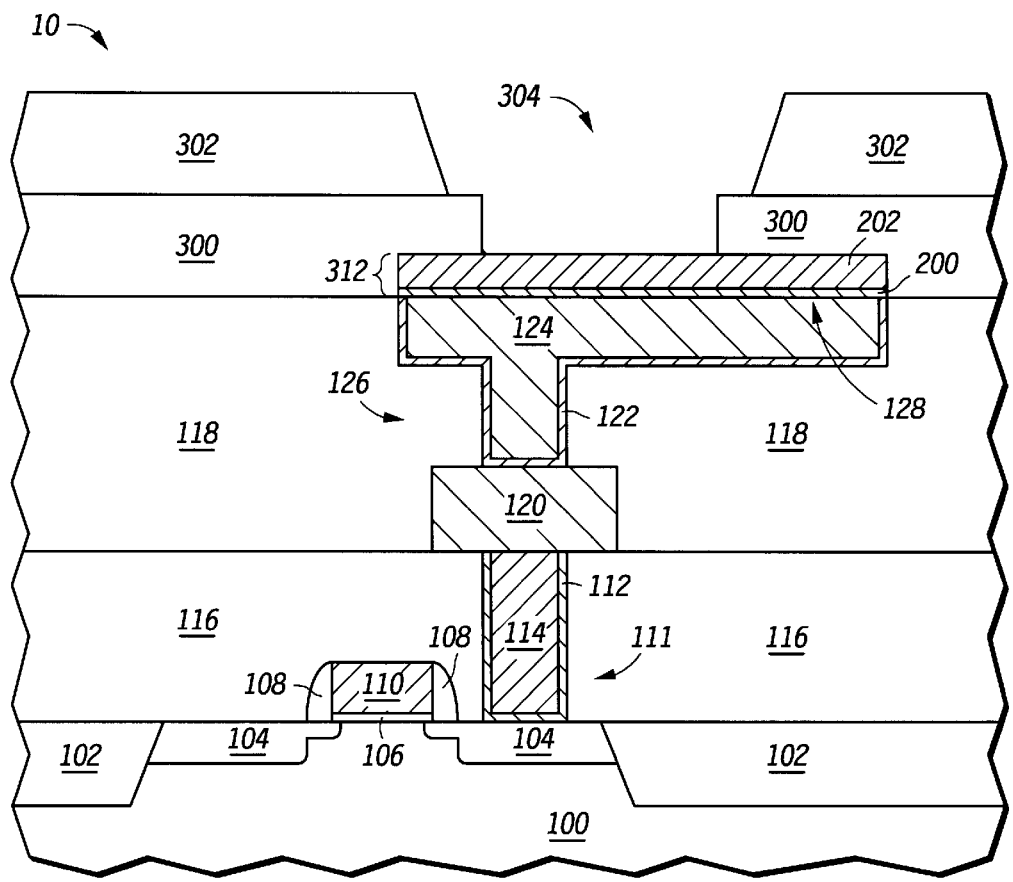
FIG. 3 includes an illustration of a cross-sectional view of FIG. 2 after forming passivation and polyimide layers over the semiconductor substrate.

FIG. 3 illustrates the cross-section of FIG. 2 and further shows that the transitional metallurgy layer 206 has been etched to form a transitional metallurgy structure 312 overlying the bond pad 128. After forming the transitional metallurgy structure 312, a passivation layer 300 is formed overlying the transitional metallurgy structure 312 and the ILD 118. Typically, the passivation layer 300 is formed using dielectrics such as plasma-enhanced nitride (PEN), silicon oxynitride (SiON) or a combination of thereof. The passivation layer 300 is then lithographically patterned and etched to form an opening that exposes portions of the transitional metallurgy structure 312. An optional polyimide (die coat) layer 302 is then formed over the passivation layer 300. The polyimide layer is lithographically patterned and then etched (or developed) to form a die coat opening that exposes the opening defined in the passivation layer 300 and the exposed portions of the transitional metallurgy structure 312.

Figure 4:
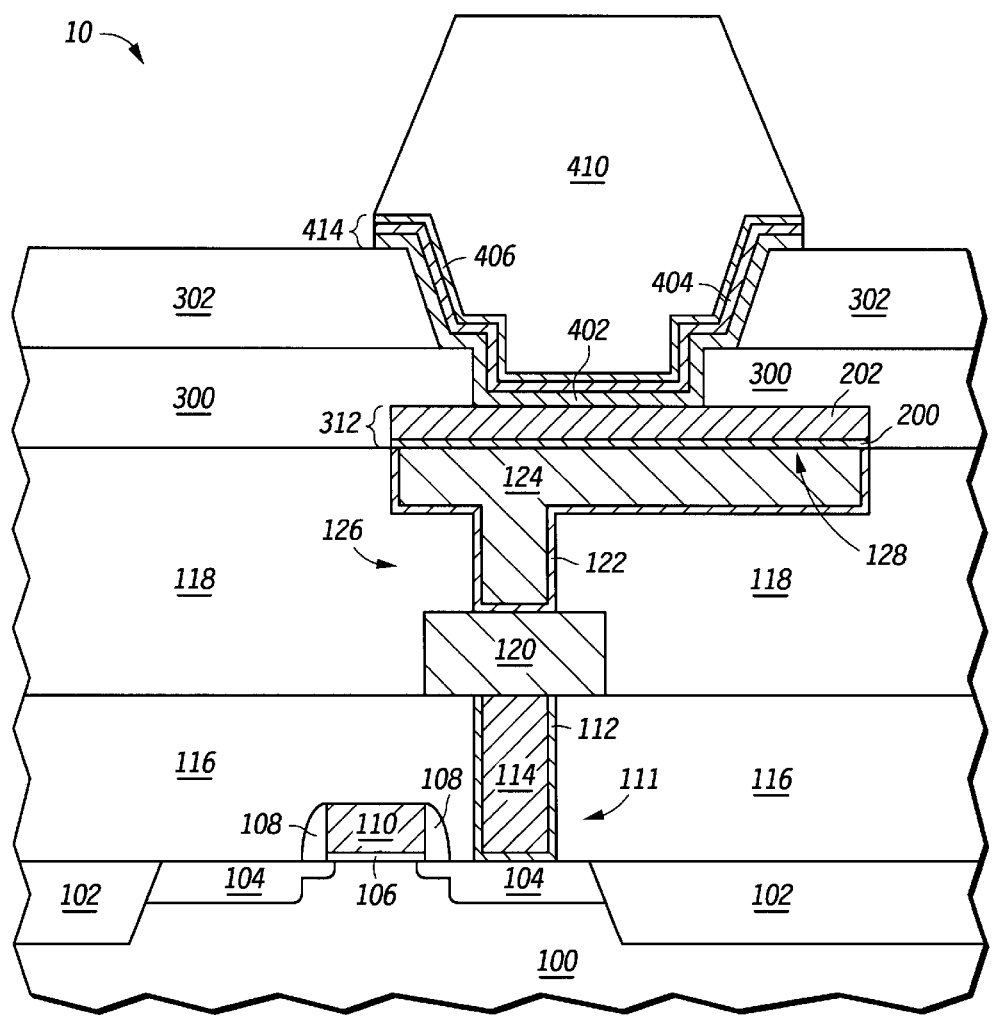
FIG. 4 includes an illustration of a cross-sectional view of the substrate of FIG. 3 after depositing an underbump metallurgy and solder bump over the semiconductor substrate.

As illustrated in FIG. 4, a semiconductor device underbump metallurgy (UBM) 414 is then formed within the die coat opening 304 and a conductive bump 410 is formed over the UBM 414. Although the UBM 414 is illustrated and discussed in the figures as being formed abutting the transitional metallurgy structure 312, this is not necessarily a requirement for embodiments of the present invention. The UBM 414 can alternatively be formed directly on the bond pad 128 (or other intervening structures). In one specific embodiment of the present invention, UBM 414 comprises a combination of films that include an adhesion film 402, a phased-region 404 and an oxidation-inhibiting layer 406.

In accordance with one specific embodiment, prior to forming the UBM, the semiconductor substrate surface including the insulator pads (die coat openings) are first optionally cleaned using a conventional reverse-sputter-bombardment process, such as ion cleaning or milling. Then after preparing the substrate's surface, an adhesion film 402, typically a layer of chromium is deposited through a patterned bump mask (not shown) onto the open insulator pads. This is followed by a deposition of a mixed phased-region 404 consisting of, in one embodiment, approximately 50 weight percent (wt. %) chromium, 25 wt. % copper and 25 wt. % nickel, wherein the proportional distribution of the chromium, copper, and nickel is relatively uniform throughout the phased-region. An oxidation-inhibiting gold layer 406 is then formed overlying the phased region 404.

In addition to using chromium, other metals such as titanium, tungsten, titanium/tungsten, and other similar refractory metal and combinations of refractory metals can be used to form either the adhesion film 402 or as a component element in the phased-region. Additionally, while the present embodiment discloses a phased region consisting of the approximately 50% chromium, 25% copper and 25% nickel, one of ordinary skill in the art recognizes that the percentages of these component elements can be varied to obtain specific film properties, such as degree of intermetallic formation, increased adhesion, reduced spalling, robustness to temperature variation, etc., as will subsequently discussed.

Figure 5:
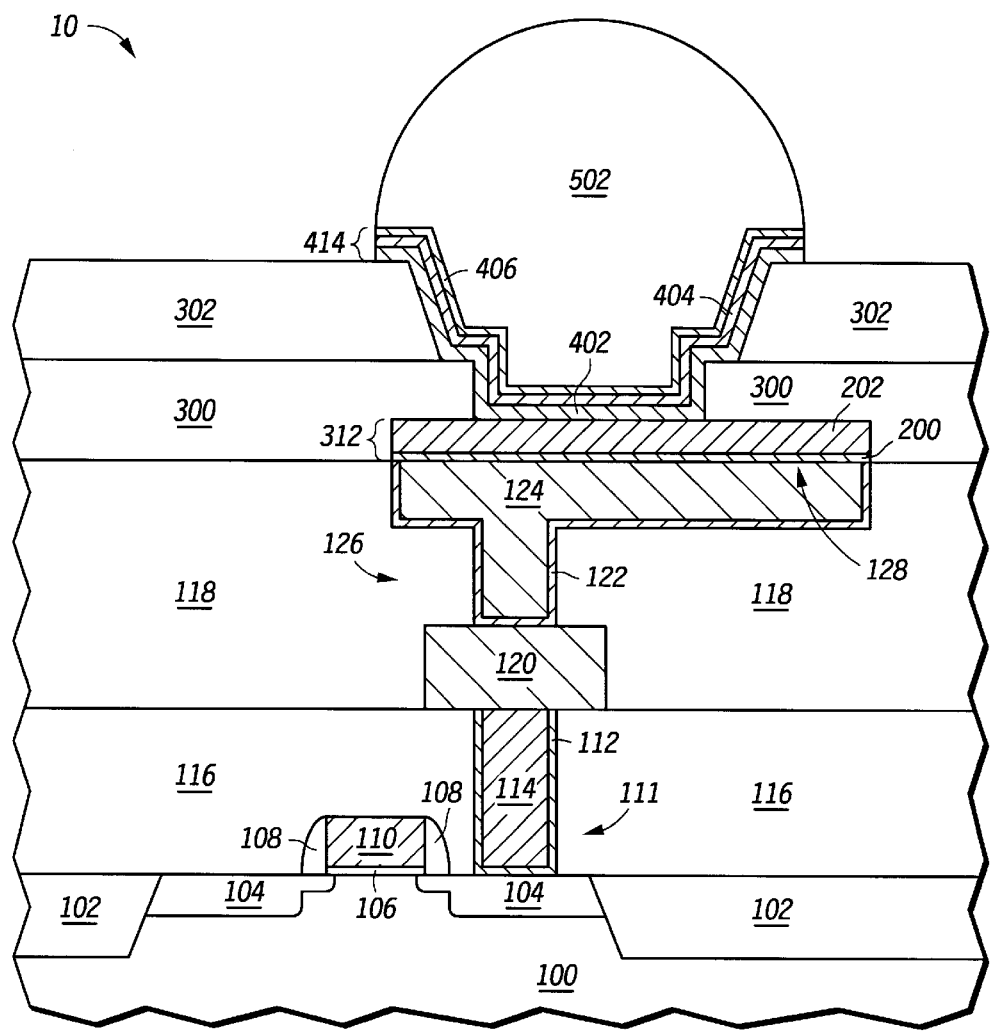
FIG. 5 includes an illustration of a cross-sectional view of FIG. 4 after performing a reflow operation and forming a C4 bump.

After forming the gold layer 406, a tin-containing solder bump 410, is deposited through the patterned bump mask onto the UBM thereby forming a pre-reflow C4 bump structure, similar to that illustrated in FIG. 4. Typically the bump 410 and UBM 414 are deposited during separate deposition processes in separate processing chambers, however this is not necessarily a requirement of the present invention. Finally, after the solder bump 410 is deposited, the metal mask is removed and the solder bump 410 is reflowed onto the UBM, thereby forming a C4 bump 502, as illustrated in FIG. 5.

Typically the chromium layer 402 is deposited to a thickness in a range of 50–500 nanometers; the phased-region 404 is deposited to a thickness in a range of approximately 100–300 nanometers and the gold layer is deposited to a thickness in a range of approximately 80 to 140 nanometers. The phased region 404 can be formed using a single composite chromium/nickel/copper sputtering target or, alternatively by using individual sputtering targets of chromium, nickel, and copper, or combinations thereof. For a particular application, the percent composition of chromium, nickel, and copper can be tailored to obtain a particular characteristic, for example bond strength, barrier integrity, reliability, etc.

In an alternative embodiment, instead of using a patterned bump mask, the composite UBM layers (chromium layer 402, phased-region layer 404, and gold layer 406) are sequentially deposited as a blanket films onto the substrate surface. The solder bump is then deposited locally through a metal mask over portions of the UBM corresponding with the underlying substrate bond pads. The solder bump can be deposited by electroplating, physical deposition, or using screening pastes, as know to one of ordinary skill in the art, having the appropriate metallurgical mix. In this embodiment, the solder bump functions as a protective mask during removal of exposed portions of the UBM. The exposed portions of the UBM are removed using conventional chemical or physical etching processes. The etching process can be performed either before or after reflow of the bump.

The disclosed phased-region 404 enhances overall intermetal adhesion between the conductive bump 410 and the conductive bond pad 128 because the presence of nickel in the phased region inhibits $Cu_6Sn_5$ intermetallic formation. The nickel competes with the copper for excess tin during bump reflow (or other high-temperature) processing thereby retarding the formation of the $Cu_6Sn$ intermetallic and instead forming nickel and tin intermetallics, such as $Ni_3Sn_4$, $Ni_3Sn_2$, and $Ni_3Sn$. The disclosed phased-region 404 results in conversion of the excess tin to tin-containing intermetallics at a much slower rate than a phased-region consisting of only chromium and copper. Slower forming nickel and tin intermetallics provide a stabilizing function as they inhibit formation of the $Cu_6Sn_5$ intermetallic by forming a secondary nickel and tin intermetallic growth around the $Cu_3Sn$ intermetallic. In the presence of molten tin, tin and nickel intermetallics form approximately 100 times slower than a tin and copper intermetallics. However, a benefit of retaining copper in the phased region is advantageously realized, because the presence of copper ensures localized quick growing and anchoring nucleation sites of copper/tin.

The disclosed UBM structure 414 advantageously eliminates a need for the prior art's thick copper-wetting layer which has been observed to be quickly converted and dissolved into the bulk solder as $Cu_6Sn_5$. Accordingly, in the present invention, the phased-region 404 functions as the primary wetting surface for the solder bump. In addition, the disclosed UBM provides a standard platform that can be integrated with a variety of solder bump metallurgies, including eutectic 63% tin/37% lead solder, 96.5% tin/3.5% silver solder, 99.3% tin/0.7% copper solder, 95% tin/5% antimony solder, 96.3% antimony/3% silver/0.7% copper solder, as well as a variety of lead/tin solder alloys having compositions ranging from high-lead to high-tin, for example solder materials comprising approximately 97% lead and 3% tin to solder materials comprising approximately 100% tin. This will be an especially important consideration as the semiconductor industry migrates away from the eutectic tin-lead solder and towards higher temperature tin-based solders as cladding or lower temperature tin-based solder as bumps.

The previous embodiment disclosed an embodiment wherein the proportional concentration of constituents is evenly distributed throughout the phased-region 404. Because the relative amounts of copper and nickel are continuous throughout the phased-region 404 the intermixed grains of copper and tin provide a buffering mix of both rapid (copper-tin) and slow-forming (nickel-tin) intermetallics at the surface of the phased-region 404. In an alternative embodiment, the proportional concentrations of copper and nickel are graded throughout the phased-region 404 to more accurately control the amount of copper and/or nickel available for the corresponding intermetallic formation. For example if it is desired to initially produce a combination of intermetallics, between the phased-region 404 and the conductive bump 502, that have relatively low amounts of copper and high amounts of nickel, the concentration of nickel at the uppermost surface of the phase region can be increased relative to the amount of copper. Correspondingly, if and where increased amounts of the copper/tin intermetallic are desired, the relative amount of copper in the phased-region 404 can be increased accordingly.

Because of the difficulty in predicting and controlling the exposure time and temperature of a C4 bumped structure during the chip's manufacture and field usage, the disclosed UBM is more robust with respect to subsequent temperature exposure than prior art UBMs. This wider temperature latitude is attributed to the combination of the UBMs preference for initially forming the adhesion promoting Copper/Tin intermetallics ($Cu_3Sn$) upon initial exposure to elevated temperatures followed by its formation of the nickel-tin intermetallics upon extended exposure to and/or elevated temperatures. Unlike the prior art, the extended temperatures do not adversely result in formation of the $Cu_6Sn_5$ intermetallics because the phased-region forms the competing nickel and tin intermetallics ($Ni_3Sn_4$, $Ni_3Sn_2$, and $Ni_3Sn$) as the additional high-temperature processing occurs. Examples of these subsequent high temperature processes can include, for example, a rework at bump-processing, burn-in, test, or the like operations.

At this point in the process, after reflowing the bump 502, a substantially completed semiconductor device 10 has been fabricated as shown in FIG. 5. This semiconductor device 10 can subsequently be attached to the cladding of a packaging substrate such as a flip chip or ball grid array package. Although not shown, other levels of interconnects can be formed as needed. Similarly, other interconnects can also be made to the gate electrode 110 and the doped regions 104. If additional interconnects are be formed, they can be formed using processes similar to those used to form and deposit the second ILD layer 118, the first conductive plug 111, the first level interconnect 120, or the second level interconnect 126.

In addition to the foregoing, the embodiments described herein are advantageous for several additional reasons. As discussed previously, the disclosed UBM is advantageous from a manufacturability standpoint in that it eliminates the otherwise required thick copper solderable layer over the phased-region. This reduces material costs, eliminates a processing step, as well as reduces the potential for misprocessing. The disclosed UBM's phased-region is also easily integrated into existing process flows without a need to use exotic materials, develop new processes, or purchase new processing equipment. Further, the disclosed UBM, is compatible with a host of other tin-containing bump solder materials, in addition to lead, such as silver, copper, antimony, and the like.

In the forgoing specification, the invention has been described with reference to specific embodiments. However, one of ordinary skill in the art appreciates that various modifications and changes can be made without departing from the scope of the present invention, as set forth in the claims below. Accordingly, the specification and figures are to be regarded in an illustrative rather than a restrictive sense and all such modifications are intended to be included within the scope of the present invention. Benefits, other advantages, and solutions to problems have been described with regard to specific embodiments. However, the benefits, advantageous, solutions to problems, and any elements that may cause any benefit, advantage, or solution to occur or become more pronounced are not to be construed as a critical, required, or essential feature or element of the claims.

What is claimed is:

1. A method for forming a semiconductor device underbump metallurgy comprising forming a copper, chromium and nickel-containing phased-region layer as a portion of the underbump metallurgy, wherein a proportional concentration of copper, chromium and nickel constituents of the phased-region layer is distributed throughout the phased-region layer, further comprising: forming an adhesion layer below the copper, chromium and nickel-containing phased region layer; forming an oxidation-inhibiting layer over the copper, chromium and nickel-containing phased-region layer; and forming a tin-containing conductive bump overlying the semiconductor device underbump metallurgy, wherein a reflow of the tin-containing conductive bump causes tin to migrate from the tin-containing conductive bump to the copper, chromium and nickel-containing phased-region and form an intermetallic comprising nickel and tin.

2. The method of claim 1, wherein an amount of chromium is approximately 50 wt %, an amount of copper is approximately 25 wt % and an amount of nickel is approximately 25 wt %.

3. The method of claim 1, wherein the copper, chromium and nickel-containing phased-region layer has a thickness in a range of approximately 100–300 nanometers.

4. The method of claim 1, wherein the adhesion layer is further characterized as a refractory metal containing layer and the oxidation-inhibiting layer is further characterized as a gold layer.

5. The method of claim 1, wherein a concentration of an amount of nickel is varied within the copper, chromium and nickel-containing phased region layer.

6. The method of claim 1, wherein a concentration of an amount of copper is varied within the copper, chromium and nickel-containing phased region layer.

7. The method of claim 1, wherein a concentration of an amount of copper and a concentration of an amount of nickel are each evenly distributed within the copper, chromium and nickel-containing phased region.

* * * * *